United States Patent
Moore

(10) Patent No.: US 7,861,128 B1
(45) Date of Patent: Dec. 28, 2010

(54) SCAN ELEMENT WITH SELF SCAN-MODE TOGGLE

(75) Inventor: Christopher T. Moore, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 1048 days.

(21) Appl. No.: 11/639,996

(22) Filed: Dec. 14, 2006

(51) Int. Cl.
*G01R 31/28* (2006.01)

(52) U.S. Cl. .................. 714/726; 714/30; 714/727; 714/729

(58) Field of Classification Search .................. None
See application file for complete search history.

(56) References Cited

U.S. PATENT DOCUMENTS

| | | | |
|---|---|---|---|
| 6,813,738 B2 * | 11/2004 | Whetsel, Jr. ................. | 714/727 |
| 7,640,475 B2 * | 12/2009 | Ravikumar et al. ......... | 714/731 |
| 2006/0100810 A1 * | 5/2006 | Van De Logt et al. ....... | 702/117 |
| 2008/0307280 A1 * | 12/2008 | Putman et al. .............. | 714/727 |

OTHER PUBLICATIONS

Bapat, Shekhar, "Methods of Testing a User Design in a Programmable Integrated Circuit", U.S. Appl. No. 11/500,526, filed Aug. 8, 2006, pp. 1-18, available from Xilinx, Inc., 2100 Logic Drive, San Jose, CA 95124.

* cited by examiner

*Primary Examiner*—John P Trimmings
(74) *Attorney, Agent, or Firm*—Robert M. Brush

(57) ABSTRACT

A scan element with self scan-mode toggle is described. In an example, the scan element is configured to automatically switch between a capture mode and a scan mode. In the capture mode, data is captured from logic under test. In the scan mode, the captured data is scanned out for testing. The scan elements each include a shift register that serves a dual purpose of providing control for determining when the scan element is to switch from the capture mode and the scan mode, as well as providing a location to store captured data.

17 Claims, 6 Drawing Sheets

SCAN ELEMENT WITH SELF SCAN-MODE TOGGLE

FIELD OF THE INVENTION

One or more aspects of the invention relate to scan testing of integrated circuit logic and, more particularly, to a scan element with self scan-mode toggle.

BACKGROUND OF THE INVENTION

Integrated circuits include many millions of gates that make up various functional components, such as flip-flops, multiplexers, and like type digital logic elements. Exemplary integrated circuits include application specific integrated circuits (ASICs), programmable logic devices (PLDs), such as field programmable gate arrays (FPGAs), and the like. A manufacturer may test logic elements in an integrated circuit using a scan chain of flip-flops. Each flip-flop in the scan chain is coupled to a logic element in logic under test. For a given input stimulus, the logic elements under test are expected to produce a particular output ("expected output").

In a conventional scan chain, each flip-flop is switched back and forth between a capture mode and a scan cycle. During the capture mode, each flip-flop captures one bit of data from a logic element under test. During the scan cycle, the bits in the flip-flops are serially shifted out of the scan chain. The shifted-out bits are compared with the expected output values. The comparison results are used to validate functionality of the logic under test, as well as the integrated circuit. This technique has many disadvantages.

First, because the capture and scan modes are interlaced for each bit, it is not possible to perform bursts of high speed testing on the integrated circuit. Second, a conventional scan chain requires a separate control line for switching the flip-flops between capture and scan modes. The need to route this control signal to possibly thousands of flip-flops across the integrated circuit requires significant test circuit overhead. The term "test overhead" refers to resources required during testing and verification, but not required during actual operation of the logic under test. Reduction in test overhead is desirable, since a failure in a test resource may disqualify an integrated circuit part, even if the resources intended for use by a customer are fully functional. Accordingly, there exists a need in the art for a more efficient scan chain structure for functional verification and testing of integrated circuits.

SUMMARY OF THE INVENTION

A scan capture element with self scan-mode toggle is described. An aspect of the invention relates to a scan element of a scan chain in an integrated circuit. The scan element includes a multiplexer, a shift register, and a flip-flop. The multiplexer includes a first input, a second input, a control input, and an output. The first input is coupled to a logic block under test in the integrated circuit and the second input is coupled to a preceding scan element of the scan chain. The shift register includes an input and an output. The input of the shift register is coupled to the output of the multiplexer. The flip-flop includes an input, an output, and a clock enable. The input of the flip-flop is coupled to the output of the shift register. The output of the flip-flop is coupled to the control input of the multiplexer and is configured to drive the clock enable.

Another aspect of the invention relates to capturing an observation signal of a logic element at a scan element of a scan chain in an integrated circuit. A shift register is loaded with an initial sequence of values. The initial sequence includes an asserted value followed by a plurality of de-asserted values from input to output of the shift register, respectively. The observation signal is selected for input to the shift register. Values of the observation signal are captured at the input of the shift register and the initial sequence of values stored in the shift register is shifted towards the output thereof. A scan signal generated by a second scan element of the scan chain is selected for input to the shift register when the asserted value of the initial sequence of values in the shift register reaches the output thereof. Values of the scan signal are captured at the input of the shift register and the values of the observation signal stored in the shift register are shifted towards the output thereof.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
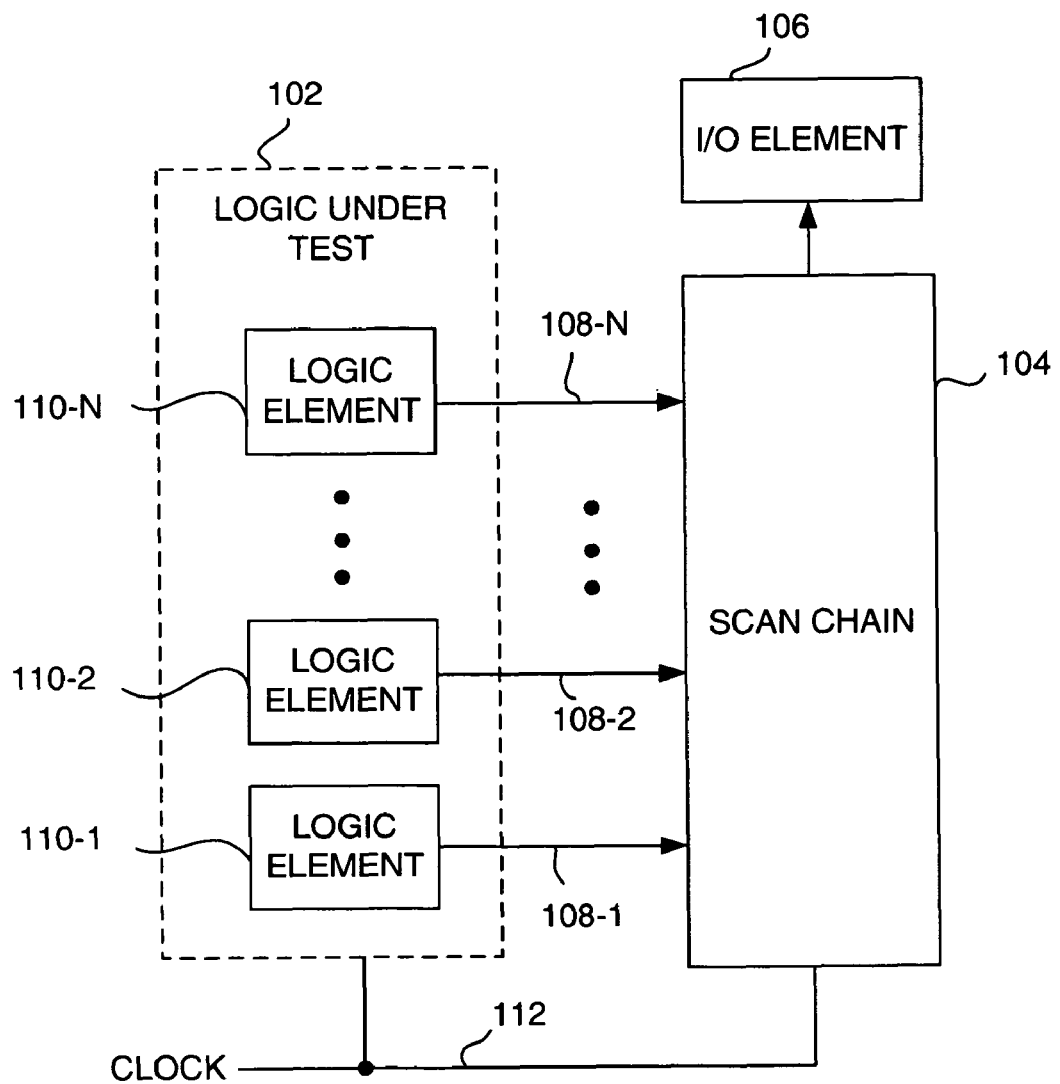
FIG. 1 is a block diagram depicting an exemplary embodiment of a test structure in an integrated circuit in accordance with one or more aspects of the invention.

FIG. 1 is a block diagram depicting an exemplary embodiment of a test structure 100 in an integrated circuit in accordance with one or more aspects of the invention. The test structure 100 includes logic under test 102, a scan chain 104, and an input/output (I/O) element 106. The test structure 100 comprises resources of an integrated circuit, such as an application specific integrated circuit (ASIC), application specific standard product (ASSP), programmable logic device (PLD), or the like. In particular, the logic under test 102 comprises a circuit implemented using resources of the integrated circuit. The logic under test 102 includes logic elements 110-1 through 110-N (collectively referred to as logic elements 110), where N is an integer greater than zero. The logic elements 110 may include various types of logic elements, such as flip-flops, logic gates, multiplexers, and the like.

The logic elements 110-1 through 110-N are coupled to the scan chain 104 via observation points 108-1 through 108-N, respectively (collectively referred to as observation points 108). In a capture mode, the scan chain 104 is configured to capture values on the observation points 108 for a predetermined number of test cycles. For each observation point 108, the scan chain 104 captures a sequence of values. The number of values in each sequence is referred to as the capture length, which is equal to the predetermined number of test cycles. After the test cycles have been executed, the scan chain automatically switches from the capture mode to a scan mode. In the scan mode, the scan chain 104 shifts out the captured values through the I/O element 106 in whole increments of the capture length. The I/O element 106 comprises any well known I/O circuit coupled to a pin on the integrated circuit package. Once all of the captured values have been shifted out, the scan chain 104 automatically switches back to the capture mode. The logic under test 102 and the scan chain 104 operate in accordance with a clock signal 112.

Figure 2:
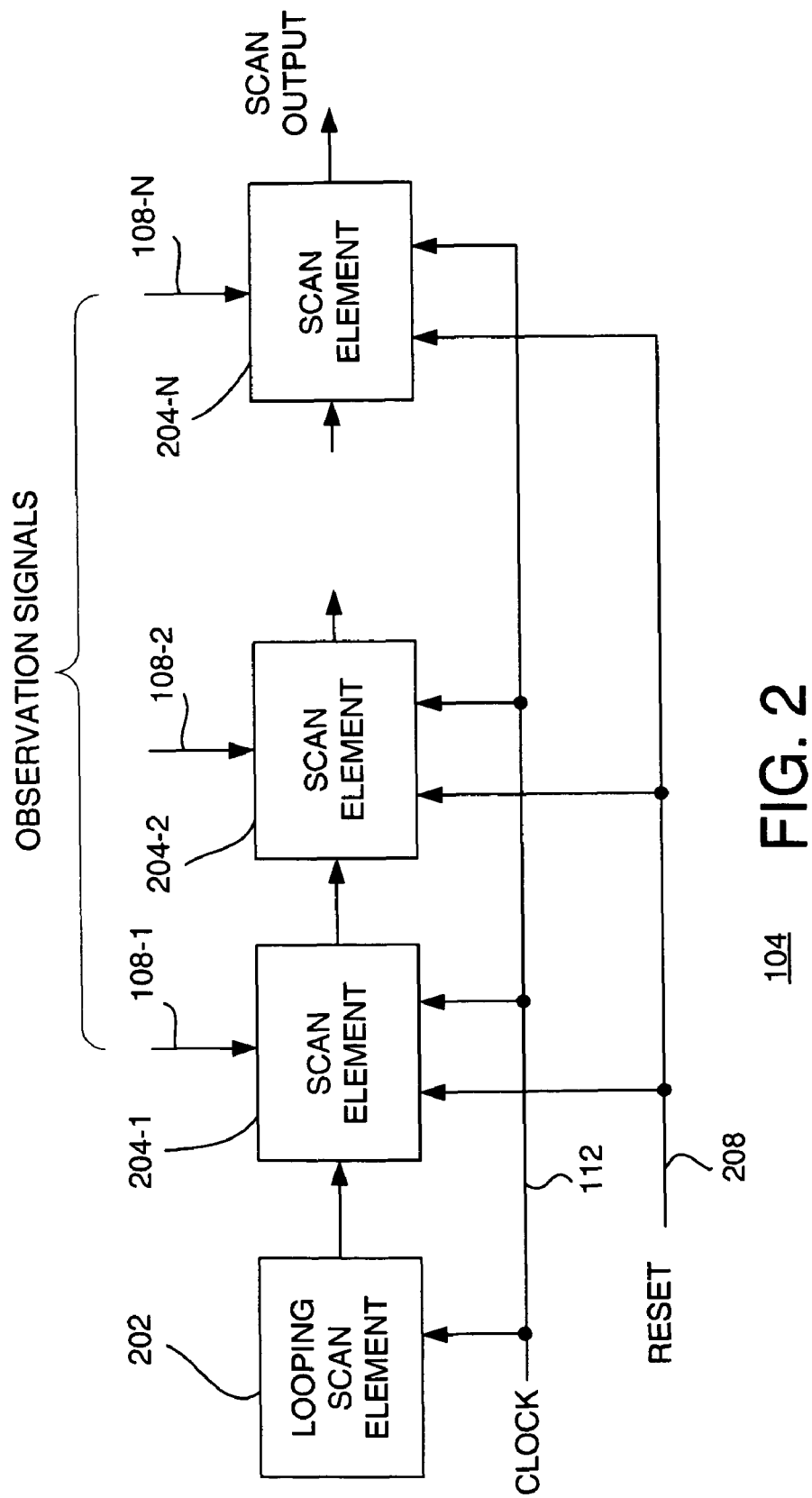
FIG. 2 is a block diagram depicting an exemplary embodiment of a scan chain in accordance with one or more aspects of the invention.

FIG. 2 is a block diagram depicting an exemplary embodiment of the scan chain 104 in accordance with one or more aspects of the invention. The scan chain 104 comprises a plurality of scan elements, e.g., a looping scan element 202 and scan elements 204-1 through 204-N (collectively referred to as scan elements 204). Inputs of the scan elements 204-1 through 204-N are coupled to the observation points 108-1 through 108-N, respectively. The looping scan element 202 is coupled to the scan element 204-1, the scan element 204-1 is coupled to the scan element 204-2, and so on until the scan element 204-N-1 is coupled to the scan element 204-N. An output of the scan element 204-N is coupled to the I/O element 106. Clock ports of the looping scan element 202 and the scan elements 204 are configured to receive the clock signal 112. Reset ports of the scan elements 204 are configured to receive a reset signal 208.

Figure 3:
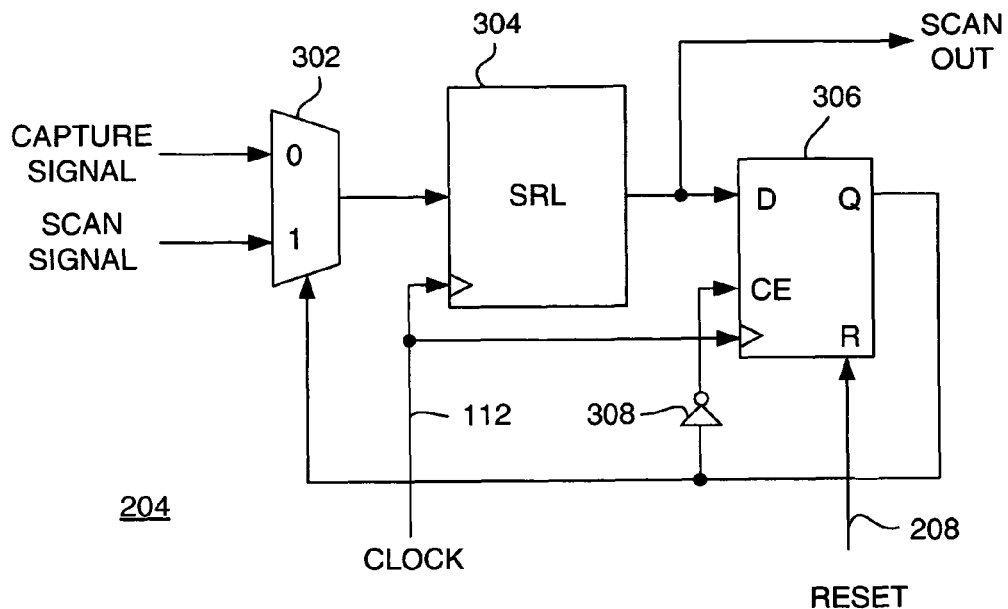
FIG. 3 is a block diagram depicting an exemplary embodiment of a scan element in the scan chain of FIG. 2 in accordance with one or more aspects of the invention.

FIG. 3 is a block diagram depicting an exemplary embodiment of a scan element 204 in accordance with one or more aspects of the invention. The scan element 204 includes a multiplexer 302, a shift register (SRL) 304, and a flip-flop 306. An output terminal of the multiplexer 302 is coupled to an input terminal of the shift register 304. An output terminal of the shift register 304 is coupled to a data input terminal (D) of the flip-flop 306. A data output terminal (Q) of the flip-flop 306 is coupled to a control terminal of the multiplexer 302 and a terminal of an inverter 308. Another terminal of the inverter 308 is coupled to a clock enable terminal (CE) of the flip-flop 306. A reset (R) terminal of the flip-flop 306 is configured to receive the reset signal 208. In one embodiment, the reset signal 208 is a global reset signal of an integrated circuit. A global reset signal is configured to reset all or a portion of the flip-flops in the integrated signal. Clock terminals of the shift register 304 and the flip-flop 306 are configured to receive the clock signal 112. Note that the shift register 304 may include one or more shifting stages, where data presented at the input terminal of shift register 304 is shifted sequentially through the shifting stages based on the clock signal 112. For example, in one embodiment, shift register 304 may include 16 shifting stages.

The output terminal of the shift register 304 is configured to provide scan data output. An input terminal of the multiplexer 302 is configured to receive a capture signal from an observation point. The input terminal receiving the capture signal is selected when the control terminal is driven with a logic low. Another input terminal of the multiplexer 302 is configured to receive a scan signal from a preceding scan element. That is, the other input terminal of the multiplexer 302 is coupled to the output terminal of a shift register in a preceding scan element in the chain. The input terminal receiving the scan signal is selected when the control terminal is driven with a logic high. Except for the scan element 204-N, the output terminal of the shift register 304 is coupled to an input terminal of a multiplexer in a following scan element in the chain. For the scan element 204-N, the output terminal of the shift register 304 is coupled to the I/O element 106.

Figure 4:
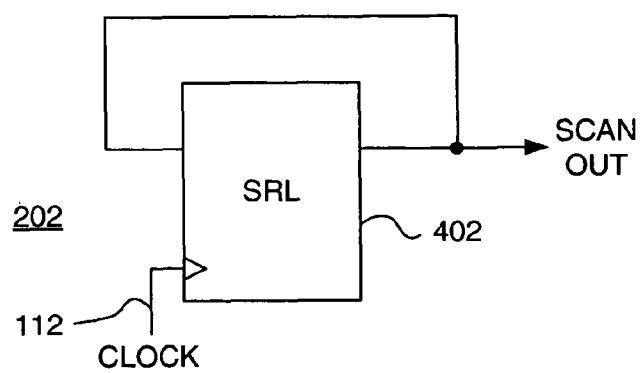
FIG. 4 is a block diagram depicting an exemplary embodiment of a looping scan element in the scan chain of FIG. 2 in accordance with one or more aspects of the invention.

FIG. 4 is a block diagram depicting an exemplary embodiment of the looping scan element 202 in accordance with one or more aspects of the invention. The looping scan element includes a shift register 402. An input terminal of the shift register 402 is coupled to its output terminal. The output terminal of the shift register 402 is configured to provide scan data output. In particular, the output terminal of the shift register 402 is coupled to an input terminal of the multiplexer in the scan element 204-1. A clock terminal of the shift register 402 is coupled to the clock signal 112.

For purposes of exposition in the following description, the shift registers 304 and 402 may considered to be a chain of flip-flops. As described below, the actual physical implementation of the shift registers 304 and 402 may be something other than a chain of flip-flops, such as a lookup table (LUT). The "input" of the shift registers 304 and 402 is the input of the first flip-flop in the chain, and thus the value stored at the input of the shift registers 304 and 402 is the value stored in the first flip-flop. The "output" of the shift registers 304 and 402 is the output of the last flip flop in the chain, and thus the value stored at the output of the shift registers 304 and 402 is the value stored in the last flip-flop. When a value is "shifted into" the shift registers 304 and 402, the value is clocked into the first flip-flop, the value stored in the first flip-flop is clocked into the second flip-flop, and so on down the chain. Thus, the contents of the shift registers 304 and 402 are shifted towards the output. The value stored in the last flip-flop is considered to be "shifted out" in that this value is clocked into another element (e.g., a flip-flop and/or shift register).

Operation of the scan chain 104 may be understood with reference to FIGS. 2 through 4. The scan elements 204 are initialized in the capture mode. For each of the scan elements 204, the SRL 304 is loaded with an initial sequence of values ("initialization vector"). In one embodiment, the initialization vector includes a logic high followed by a plurality of logic lows (e.g., 1000 . . . 0). The initialization vector is loaded in the shift register 304 such that the logic high value is at the input and the last logic low value is at the output. The shift register 304 is configured to store the number of bits in the initialization vector. In addition, in each of the scan elements 204, the flip-flop 306 is initially cleared (i.e., the output Q is a logic low). Since the output Q of the flip-flop 306 is initially a logic low, a logic high is coupled to the CE input of the flip-flop 306, which enables the flip-flop to latch the output of the shift register 304 in accordance with the clock signal. Also, a logic low is coupled to the control terminal of the multiplexer 302, thereby causing the multiplexer 302 to select the capture signal.

Once initialized, the clock signal 112 is applied to the scan chain 104. For each clock cycle, a value of the capture signal is shifted into the shift register 304 and the contents of the shift register 304 are shifted towards the output. This results in the initialization vector being shifted towards the output. Each of the scan elements 204 continues to operate in this manner for a number of clock cycles equal to the number of logic lows in the initialization vector. That is, as the logic lows in the initialization vector are shifted out of the shift register 304, the output Q of the flip-flop remains a logic low. The logic high in the initialization vector advances towards the output of the shift register 304.

When the logic high in the initialization vector reaches the output of the shift register 304, the next clock cycle will cause the flip-flip 306 to latch to the logic high. The output Q of the flip-flop 306 transitions to a logic high, thereby coupling a logic low to the CE input of the flip-flop 306 and a logic high to the multiplexer 302. Accordingly, the flip-flop 306 becomes "stuck high", since the clock port will be disabled. The multiplexer 302 is driven to select the scan data input signal. Thus, the shift register 304 will capture a number of values of the capture signal equal to the number of values in the initialization vector. Notably, since the initialization vector is passing through the flip-flop 306, there is effectively one extra-bit added to the initialization vector (that bit being the initial value of the flip-flop 306). Thus, the shift register 304 will capture one more bit than the number of logic lows in the initialization vector. In other words, the capture length is effectively equal to the number of values in the initialization vector. Thus, the capture length may be programmed or configured by adjusting the number of values in the initialization vector. When the logic high in the initialization vector is shifted out of the shift register 304, the scan element 204 transitions from the capture mode to the scan mode. This process occurs in each of the scan elements 204. Thus, the scan elements 204 automatically toggle their mode from capture to scan mode.

In the scan mode, for each clock cycle, a value of the scan signal is shifted into the shift register 304. As discussed above, the scan signal is output from the shift register in a preceding scan element. As values of the scan signal are shifted into the shift register 304, values of the capture signal are shifted out of the shift register 304. The shifted out capture signal values form the scan signal for a following scan element of the chain and are shifted into the shift register of the following scan element. For the last scan element 204-N, the shifted out capture signal values are output via the I/O element 106. After a number of clock cycles equal to N times the capture length, capture values for each of the observation signals will be shifted out of the scan chain 104.

The looping scan element 202 is also initially loaded with the same initialization vector as the scan elements 204. The initialization vector loops around the shift register 402 for each clock cycle of the clock signal. The shift register 402 provides the scan input signal for the scan element 204-1. As capture signal values are shifted out of the scan register 204-1, values of the initialization vector are shifted in. Eventually, the shift register 304 in the scan element 204-1 will be loaded with the complete initialization vector. At this point, the scan element 204-1 begins to provide values of the initialization vector to the next scan element 204-2. This process is continued down the scan chain 104 until the shift register 304 in each of the scan elements 204 is again loaded with the initialization vector and all of the captured values have been shifted out through the I/O element 106.

Therefore, after N times the capture length number of clock cycles, the captured data is scanned out and the scan elements 204 are re-initialized. Note that the scan chain 104 can be over-clocked, as long as the over-clocking is by an integer multiple of the capture length (i.e., the length of the initialization vector). This ensures that the logic high of the initialization vector is at the input of the shift register 304 in each of the scan elements 204. After the captured data has been scanned out and the scan chain 104 is re-initialized, the reset signal is strobed to reset the flip-flop 306 in each of the scan elements 204 to be cleared (i.e., output a logic low). In this manner, the scan elements 204 transition from the scan mode back to the capture mode.

Accordingly, the shift register 304 serves a dual purpose of providing the control for determining when the scan element is to switch from capture to scan mode, as well as providing a location to store a captured stream of data. The data is captured at the clock speed of the logic under test 102. Thus, the scan elements of the scan chain 104 can capture bursts of data at clock speed, which provides a greater likelihood of detecting speed related faults. The scan elements obviate the need for a separate scan control line or for interlaced capture and scan modes, which reduces test overhead. Moreover, the scan elements are capable of automatically switching between capture and scan modes.

Figure 7:
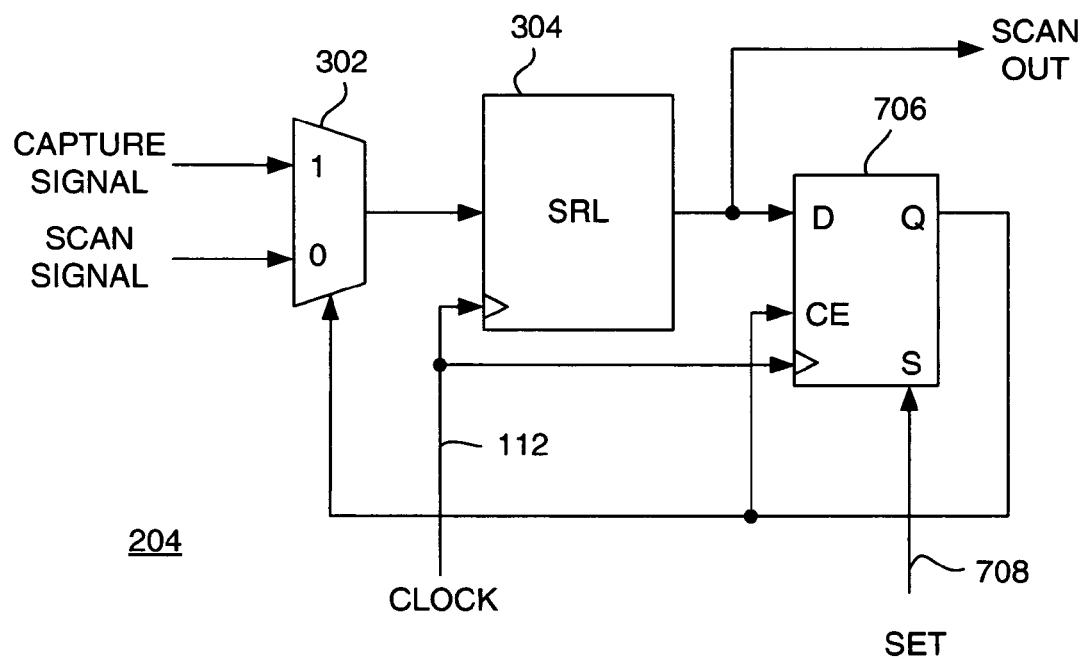
FIG. 7 is a block diagram depicting another embodiment of a scan element in the scan chain of FIG. 2 in accordance with one or more aspects of the invention.

As described above, when the logic high of the initialization vector is asserted by being latched by the flip-flop 306, the scan element 204 transitions from the capture mode to the scan mode. In this context, the logic high in the initialization vector is an "asserted value" and the logic lows are "de-asserted values." In another embodiment, the scan elements 204 may be configured to operate using a logically opposite initialization vector. That is, a logic low followed by a sequence of logic highs from input to output of the shift register 304. FIG. 7 is a block diagram depicting another embodiment of the scan element 204 in accordance with one or more aspects of the invention. The scan element 204 in FIG. 7 is configured to operate using an initialization vector having a logic low followed by logic highs. In such an embodiment, a flip-flop 706, which is similar to the flip-flop 306 except that it has a set (S) terminal instead of or in addition to a reset terminal, is initially set (stores a logic high) by a SET signal 708 coupled to the set terminal. The inverter 308 is omitted (i.e., the output of the flip-flop 306 drives its CE input directly without going through an inverter). The input paths to the multiplexer 302 are reversed, i.e., the multiplexer 302 selects the capture signal when the control terminal is driven by a logic high and the scan signal when the control terminal is driven by a logic low. Thus, in general, the initialization vector comprises an asserted value followed by a plurality of de-asserted values from input to output of the shift register 304.

In one embodiment, the scan chain 104 is implemented within a PLD, such as an FPGA. The scan chain 104 may be implemented using dedicated hardware embedded within the PLD. Alternatively, the scan chain 104 may be implemented using the programmable fabric of the PLD.

Figure 6:
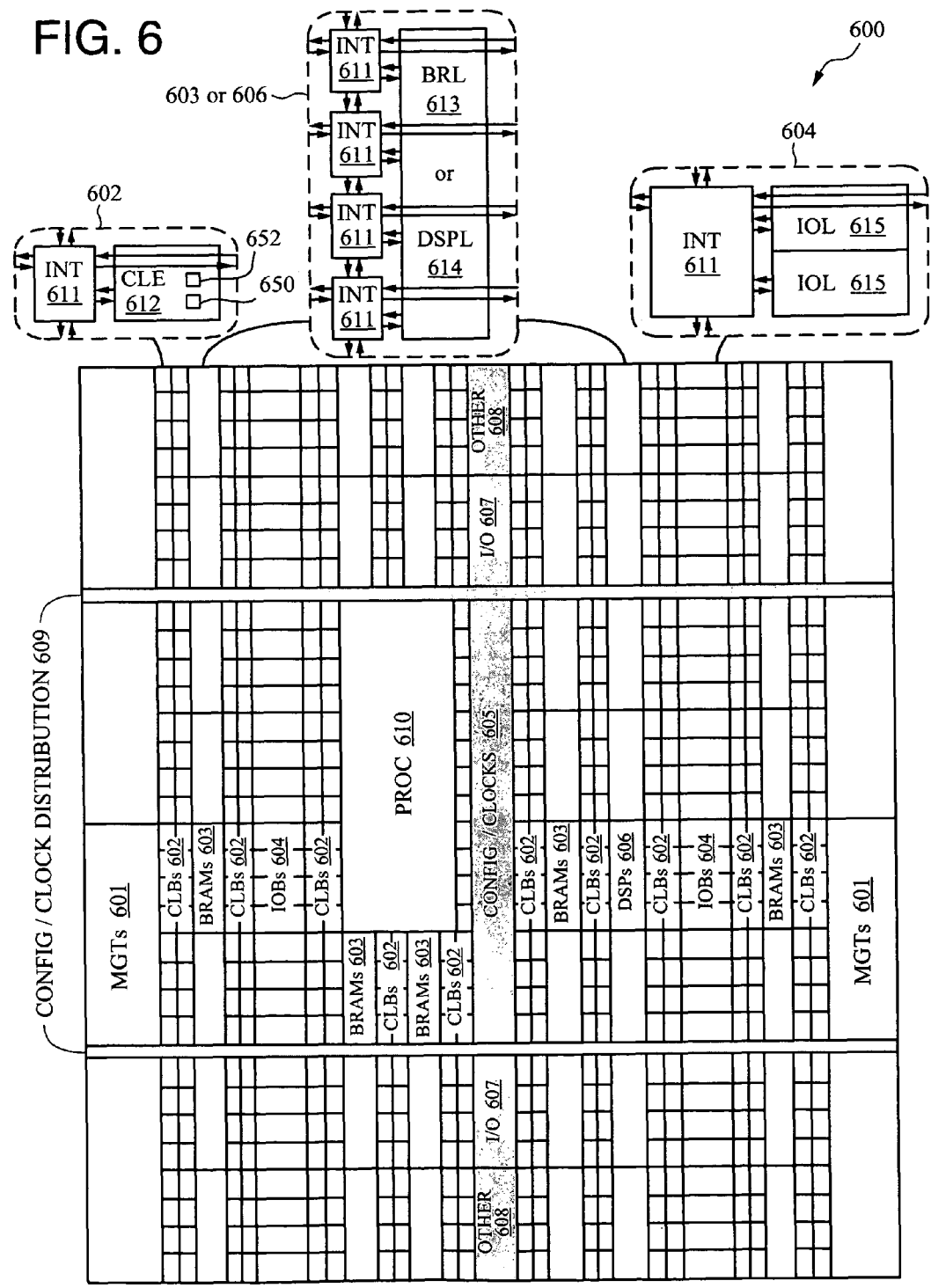
FIG. 6 illustrates an FPGA architecture with which the present invention may be employed.

In particular, advanced FPGAs can include several different types of programmable logic blocks in the array. For example, FIG. 6 illustrates an FPGA architecture 600 that includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections via routing conductor segments to and from a corresponding interconnect element in each adjacent tile. Therefore, the programmable interconnect elements and routing conductor segments taken together implement the programmable interconnect structure for the illustrated FPGA. The programmable interconnect element (INT 611) also includes the connections to and from the programmable logic element within the same tile, as shown by the examples included at the top of FIG. 6. The programmable interconnect element (INT 611) may also include connections via routing conductor segments to and from a corresponding interconnect element that span multiple columns of logic. That is, routing conductor segments may span a plurality of tiles (e.g., a "hex" line spans six tiles).

For example, a CLB 602 can include a configurable logic element (CLE 612) that can be programmed to implement user logic plus a single programmable interconnect element (INT 611). In an embodiment, the CLE 612 includes a plurality of slices of logic. One or more of the logic slices may include LUT logic 650 and associated logic 652 (e.g., flip-flops, multiplexers, etc.). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA, more than one adjacent column of CLBs is typically included wherever the CLBs appear, to facilitate the efficient implementation of user logic. Examples of FPGAs that may be used with embodiments of the invention are the Virtex 4 FPGAs available from Xilinx, Inc., of San Jose, Calif.

The scan elements 204 may be implemented using CLB slice logic in an FPGA. In one embodiment, the shift register 304 and the shift register 402 are implemented using one or more LUTs in a CLB. The multiplexer 302, the inverter 308, and the flip-flop 306 may be implemented using other logic in a CLB and/or other LUTs. An FPGA may be tested by programming the logic under test 102 and the scan chain 104 into the device. Since the scan elements 204 are capable of automatically switching between capture and scan modes and can be reset through an appropriate number of clocks followed by a reset signal, the logic under test 102 may be tested multiple times without having to re-program the device to re-initialize the scan chain 104. In some embodiments, one or more LUT may be configurable to implement a shift register, such as shift register 304.

In some embodiments described above, the initialization vector comprises a logic high followed by a sequence of logic lows from input to output of the shift register 304, respectively. The fact that the shift register 304 drives the flip-flop 306 with a logic low provides an advantage. This is because should any FPGA routing used in the scan element be shorted to any routing of the logic under test, this short may be detectable, since the scan element routing is being held to logic low. Thus, at least some of the testing circuitry overhead will not mask the ability to detect faults on resources under test if there exists a bridge fault between the overhead and these resources.

Figure 5:
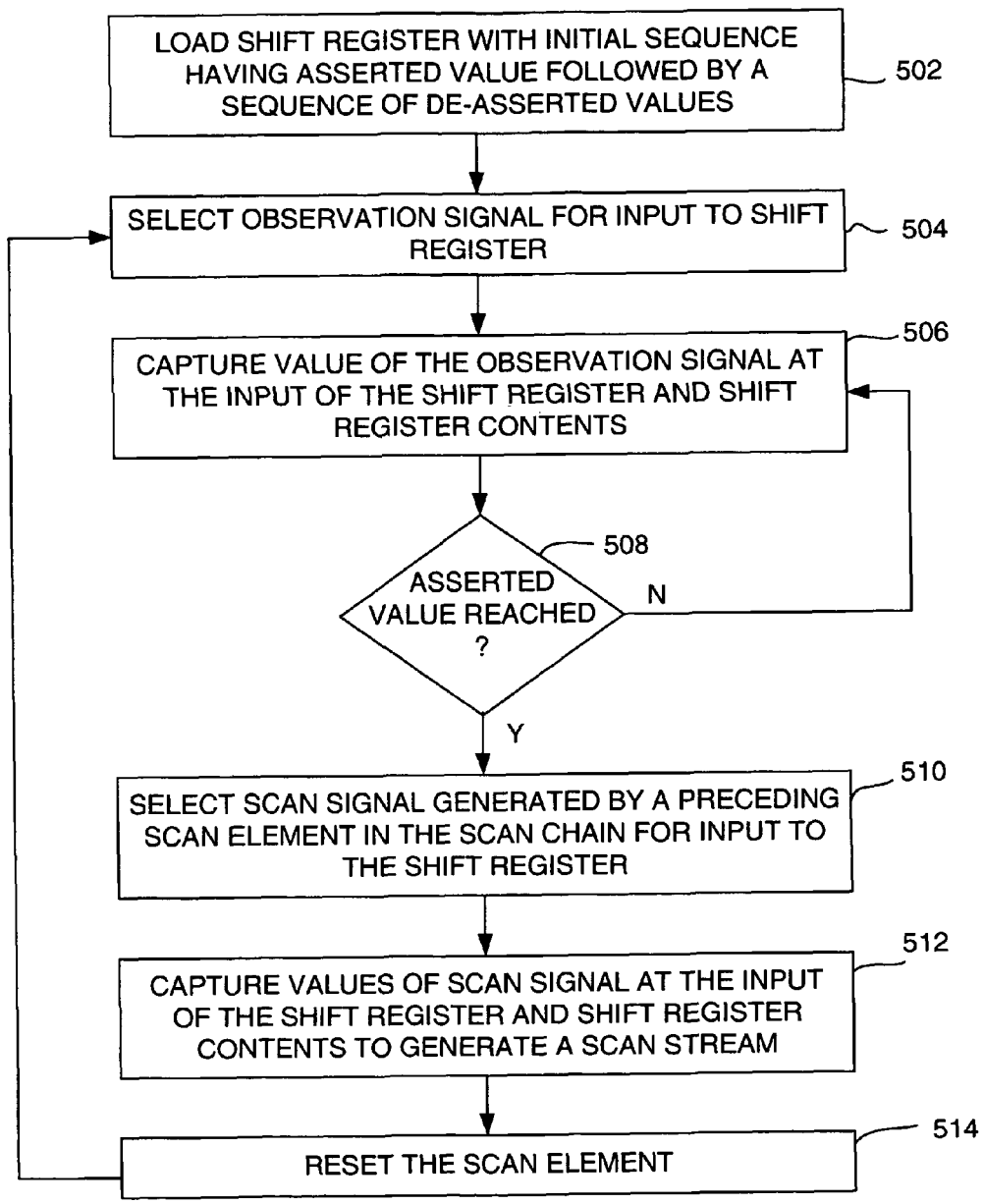
FIG. 5 is a flow diagram depicting an exemplary embodiment of a method for testing a logic element using a scan element of a scan chain in an integrated circuit in accordance with one or more aspects of the invention.

FIG. 5 is a flow diagram depicting an exemplary embodiment of a method 500 for testing a logic element using a scan element of a scan chain in an integrated circuit in accordance with one or more aspects of the invention. The method 500 begins at step 502, where a shift register in the scan element is loaded with an initial vector. The initial vector includes an asserted value and a sequence of de-asserted values from input to output of the shift register, respectively. In one embodiment, the initial vector includes a logic high followed by a sequence of logic lows from input to output of the shift register, respectively. Alternatively, the initial vector may include a logic low followed by a sequence of logic highs from input to output of the shift register, respectively. In some embodiments, the initial vector may be loaded using a looping scan element as described above. At step 504, an observation signal is selected for input to the shift register. In one embodiment, a flip-flop is coupled to latch the output of the shift register and a multiplexer drives the input of the shift register. The flip-flop drives a control terminal of the multiplexer. The flip-flop is initialized with a de-asserted value, which drives the multiplexer to select the observation signal.

At step 506, a value of the observation signal is captured at the input of the shift register and the contents of the shift register are shifted. Notably, the initial vector is shifted towards the output of the shift register. At step 508, a determination is made whether the asserted value has been shifted out of the shift register. If not, the method 500 returns to step 506 and repeats. Otherwise, the method 500 proceeds to step 510.

At step 510, a scan signal generated by a preceding scan element in the scan chain is selected for input to the shift register. In one embodiment, the flip-flop coupled to latch the shift register changes state in response to the asserted value. This drives the multiplexer to select the scan signal. The flip-flop continues to store the asserted value until a reset signal is asserted. At step 512, values of the scan signal are captured at the input of the shift register and the contents of the shift register are shifted to produce a scan stream. As described above, the scan signal includes a sequence of initialization vectors. Thus, during step 512, the shift register is re-initialized with the initialization vector. At step 514, the scan element is reset. In one embodiment, the scan element is reset by resetting the flip-flop that latches the output of the shift register.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A scan element of a scan chain in an integrated circuit, comprising:

a multiplexer having a first input, a second input, a control input, and an output, the first input coupled to a logic block under test in the integrated circuit and the second input coupled to a preceding scan element of the scan chain;

a shift register having an input and an output, the input of the shift register coupled to the output of the multiplexer; and a flip-flop having an input, an output, and a clock enable, the input of the flip-flop coupled to the output of the shift register, the output of the flip-flop coupled to the control input of the multiplexer and configured to drive the clock enable.

2. The scan element of claim 1, further comprising:

an inverter coupled between the output of the flip-flop and the clock enable of the flip-flop, the output of the flip-flop driving the clock enable through the inverter.

3. The scan element of claim 1, wherein the flip-flop further includes a reset configured to receive a reset signal coupled to the scan chain.

4. The scan element of claim 1, wherein the output of the shift register is coupled to a following scan element of the scan chain.

5. The scan element of claim 1, wherein the output of the shift register is coupled to an input/output element of the integrated circuit.

6. The scan element of claim 1, wherein the integrated circuit comprises a programmable logic device, and wherein the shift register comprises at least one lookup table of the programmable logic device.

7. A method of capturing an observation signal of a logic block under test at a scan element of a scan chain in an integrated circuit, comprising:

loading a shift register with an initial sequence of values, the initial sequence including an asserted value followed by a plurality of de-asserted values from input to output of the shift register, respectively;

selecting the observation signal for input to the shift register;

capturing values of the observation signal at the input of the shift register and shifting the initial sequence of values stored in the shift register towards the output thereof;

selecting a scan signal generated by a second scan element of the scan chain for input to the shift register when the asserted value of the initial sequence of values in the shift register reaches the output thereof; and capturing values of the scan signal at the input of the shift register and shifting the values of the observation signal stored in the shift register towards the output thereof.

8. The method of claim 7, further comprising:

providing an output stream of values for the scan element that includes the values of the observation signal and the values of the scan signal.

9. The method of claim 7, wherein the scan signal includes the initial sequence of values, and the method further comprises:

re-initializing the shift register with the initial sequence of values in the scan signal.

10. The method of claim 7, wherein a flip-flop is coupled to latch the output of the shift register and a multiplexer drives the input of the shift register, and wherein the step of selecting the observation signal comprises:

initializing the flip-flop with a de-asserted value; and
driving the multiplexer to select the observation signal.

11. The method of claim 10, wherein the step of selecting the scan signal comprises:

latching in the flip-flop the asserted value of the initial sequence of values;

driving the multiplexer to select the scan signal; and storing the asserted value in the flip-flop until a reset signal is asserted.

12. A scan chain coupled to a logic block under test in an integrated circuit, comprising:

a plurality of scan elements including a first scan element followed by second scan elements, each of the second scan elements including:

a multiplexer having a first input, a second input, a control input, and an output, the first input of the multiplexer coupled to the logic block and the second input of the multiplexer coupled to a preceding one of the plurality of scan elements;

a shift register having an input and an output, the input of the shift register coupled to the output of the multiplexer; and a flip-flop having an input, an output, and a clock enable, the input of the flip-flop coupled to the output of the shift register, the output of the flip-flop coupled to the control input of the multiplexer and configured to drive the clock enable.

13. The scan chain of claim 12, wherein the first scan element comprises:

a looping shift register having an input and an output, the output of the looping shift register coupled to the input of the looping shift register and the second input of the multiplexer of a following one of the plurality of scan elements.

14. The scan chain of claim 12, wherein the output of the shift register in a last one of the second scan elements is coupled to an input/output element of the integrated circuit, and wherein the output of the shift register in each preceding one of the second scan elements is coupled to the second input of the multiplexer of a following one of the second scan elements.

15. The scan chain of claim 12, wherein each of the second scan elements further includes:

an inverter coupled between the output of the flip-flop and the clock enable of the flip-flop, the output of the flip-flop driving the clock enable through the inverter.

16. The scan chain of claim 12, wherein the flip-flop in each of the second scan elements further includes a reset configured to receive a reset signal coupled to the scan chain.

17. The scan chain of claim 12, wherein the integrated circuit comprises a programmable logic device, and wherein the shift register in each of the plurality of scan elements comprises at least one lookup table of the programmable logic device.

* * * * *